(12) United States Patent
Ishida

(10) Patent No.: US 7,011,864 B2
(45) Date of Patent: Mar. 14, 2006

(54) FILM FORMING APPARATUS AND FILM FORMING METHOD

(75) Inventor: Hiroshi Ishida, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 232 days.

(21) Appl. No.: 10/231,193

(22) Filed: Aug. 30, 2002

(65) Prior Publication Data

US 2003/0044531 A1 Mar. 6, 2003

(30) Foreign Application Priority Data

Sep. 4, 2001 (JP) .................................. 2001-267395

(51) Int. Cl.
*B05D 1/38* (2006.01)

(52) U.S. Cl. ............... 427/240; 427/407.1; 427/419.7; 427/425

(58) Field of Classification Search ............... 427/240, 427/425, 407.1, 419.7, 336; 118/52, 320; 438/780, 782
See application file for complete search history.

(56) References Cited

U.S. PATENT DOCUMENTS

| | | | |
|---|---|---|---|
| 5,371,037 A | * 12/1994 | Yonehara | 438/459 |
| 5,393,712 A | * 2/1995 | Rostoker et al. | 438/471 |
| 5,750,000 A | * 5/1998 | Yonehara et al. | 438/459 |
| 6,246,030 B1 | 6/2001 | Matsuyama | 219/390 |
| 6,248,168 B1 | 6/2001 | Takeshita et al. | 118/52 |
| 6,306,729 B1 | * 10/2001 | Sakaguchi et al. | 438/458 |
| 6,351,039 B1 | * 2/2002 | Jin et al. | 257/759 |
| 6,365,228 B1 | * 4/2002 | Tsai et al. | 427/240 |
| 6,603,204 B1 | * 8/2003 | Gates et al. | 257/760 |
| 6,677,680 B1 | * 1/2004 | Gates et al. | 257/758 |
| 2002/0177298 A1 | * 11/2002 | Konishi et al. | 438/630 |

* cited by examiner

*Primary Examiner*—Erma Cameron
(74) *Attorney, Agent, or Firm*—Rader, Fishman & Grauer PLLC

(57) ABSTRACT

An apparatus for forming a film on a wafer comprising, a first coating apparatus coating a foaming insulation film material on the wafer, a second coating apparatus coating a non-porous insulation film material on the wafer, a low oxygen heating temperature regulating process apparatus performing a heating process on the wafer on which the foaming insulation film material is coated, a low oxygen high temperature heating process apparatus performing the heating process on the water on which the non-foaming insulation film material is coated, a transfer mechanism transferring the wafer to these apparatuses, and a selecting means selecting a path to which the wafer is transferred corresponding to the film formed on the wafer.

9 Claims, 14 Drawing Sheets

FILM FORMING APPARATUS AND FILM FORMING METHOD

BACKGROUND OF THE INVENTION

1. Field of the Invention

The present invention relates to a film forming apparatus that forms a porous insulation film and a non-porous insulation film on a substrate such as a semiconductor wafer.

2. Description of the Related Art

An insulation film is formed on a substrate in such a manner that an insulation film material is coated on the substrate, dried, and heated. A system that integrally performs a series of processing steps such as a coating process, a drying process, and a heating process for an insulation film material is known.

Recently, the improvement of the insulating characteristic of an insulation film has been required. In order to meet the requirement, a porous insulation film has been used. For such a coating material, a material such that contains porogen in an insulation film material like methyl silsesquioxane (hereinafter abbreviated as MSQ) is used. In addition, after the coating process for such a material is performed, a heating process is performed under a different condition (for example, at different temperature) from the conventional heating process for a non-porous insulation film.

In the dual damascene method, which has been widely used in recent years, to improve the etching accuracy or to form a hard mask and the like, two or more types of insulation films are laminated. Thus, usually, both of the non-porous insulation film and the porous insulation film are formed on one semiconductor wafer. Since the condition for forming the porous insulation film is different from the condition for forming the non-porous insulation film, a separate system from a system for forming the non-porous insulation film has been provided for forming the porous insulation film. Thus, the facility becomes large. In addition, a wafer has to be transferred between the systems and, as a result, the process is not effectively performed taking a long time to complete.

In general, after the porous insulation film is formed, in a case of laminating another insulation film such as the non-porous insulation film thereon, the insulation film is formed with CVD (Chemical Vapor Deposition) method. By the CVD method, a very thin film is formed in comparison with a film formed with a method of rotating the substrate, namely spin coating method. Since the front surface of a porous insulation film as a lower layer is largely rugged, an insulation film as an upper layer laminated by the CVD method is also largely rugged. As a result, a flat film cannot be formed.

SUMMARY OF THE INVENTION

The present invention is made from the above-described point of view. An object of the present invention is to provide a film forming apparatus and a film forming method that allow the installation space of the facility to be reduced and a laminate film made of a porous insulation film and a non-porous insulation film to be effectively formed.

Another object of the present invention is to provide a film forming apparatus and a film forming method that allow an upper insulation film to be flatly formed on a porous insulation film.

To solve the problem, a film forming apparatus of the present invention comprises a first coating apparatus coating a foaming material on the substrate, a second coating apparatus coating an insulation material on the substrate, a first heating apparatus heating the substrate on which the foaming material is coated so that a porous insulation film is formed thereon, a second heating apparatus heating the substrate on which the insulation material is coated so that a non-porous insulation film is formed thereon, transferring means for transferring the substrate into at least one of the first coating apparatus, the second coating apparatus, the first heating apparatus and the second heating apparatus and selecting means for selecting one of the first coating apparatus and the second coating apparatus, one of the first heating apparatus and the second heating apparatus to which the substrate is transferred to corresponding to the film formed on the substrate.

According to the present invention, with providing the selecting means that selects processing apparatuses to which the wafer W is transferred corresponding to a type of film formed on the substrate, film forming processes for a porous insulation film and a non-porous insulation film can be performed in the same system. Thus, unlike the conventional system, it is not necessary to transfer the substrate between different systems. As a result, film forming processes can be effectively performed. Thus, the installation space of the apparatus can be reduced. As a result, the time taken for processing can be shortened.

Another aspect of the film forming apparatus of the present invention comprises a first coating apparatus coating a porous insulation film material on the substrate with a spin coat process, a first heating apparatus heating the substrate on which the porous insulation material is coated so as to form a first insulation film thereon, a second coating apparatus coating a non-porous insulation film material on the substrate with the spin coat process, a second heating apparatus heating the substrate on which the non-porous insulation material is coated so as to form a second insulation film thereon and a transferring mechanism transferring the substrate among the first coating apparatus, the second coating apparatus, the first heating apparatus and the second heating apparatus.

According to the present invention, the first coating apparatus coats a porous insulation material with the spin coat process and the second coating apparatus coats a non-porous insulation material with the spin coat process. Thus, even if the front surface of the porous insulation film is largely rugged (namely, the surface roughness thereof is large), the non-porous insulation film as an upper layer can be flatly formed. In addition, since all the processes including the heating process of the first heating apparatus and the second heating apparatus are performed in the same apparatus that has a transferring mechanism, unlike the conventional art, it is not necessary to transfer a substrate between different systems. As a result, the film forming processes can be effectively performed. Thus, the installation space of the apparatus can be reduced. As a result, the time taken for processing can be shortened.

A film forming method of the present invention comprising the steps of, (a) coating a porous insulation material on a substrate with a spin coat process, (b) heating the substrate on which the porous insulation film material is coated so as to form a first insulation film thereon, (c) coating a non-porous insulation material on the substrate on which the first insulation film is formed with the spin coat process. (d) heating the substrate on which the non-porous insulation material is coated so as to form a second insulation film thereon.

According to the present invention, a porous insulation material is coated with the spin coat process. In addition, a non-porous insulation material is coated with the spin coat process in the second coating apparatus. Thus, even if the front surface of the porous insulation film is largely rugged (namely, the surface roughness thereof is large), the non-porous insulation film as an upper layer can be flatly formed.

Another embodiment of the present invention performs the steps in the order of step (a) and step (b) after performing step (d). In such a manner, since a porous insulation film as a third layer is formed with the spin coat process, the film can be effectively formed in, for example, the same apparatus.

Another example of the present invention further comprising the step (e) of reforming a front surface of the first insulation film, the step (e) being performed between the steps (b) and (c). In this example, the reforming process is performed by radiating an ultraviolet ray to the first insulation film. With such reforming process, the water absorption of the front surface of the film is improved and the film becomes hydrophilic. As a result, the contact angle of the non-porous insulation film material to the porous insulation film becomes small, therefore, the non-porous material can be easily coated. In other words, when a non-porous insulation material is spread on a substrate by the spin coat process, the material can easily be spread and flattened. In addition, since the material can easily be spread, the amount required of the material can be reduced.

Another embodiment of the present invention comprises the step of coating a solvent on the first insulation film with the spin coat process, after the reforming process. Thus, water absorption of the front surface of the porous film can be improved further. When a non-porous insulation material is spread on a substrate by the spin coat process, the material can easily be spread and flattened. In addition, since the material can easily be spread, the amount required of the material can be reduced.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENT

Next, with reference to the accompanying drawings, an embodiment of the present invention will be described.

In the embodiment, a fabrication method for a semiconductor device having a laminated film composed of three layers of insulation films in FIG. 5D will be described.

Figure 5A:
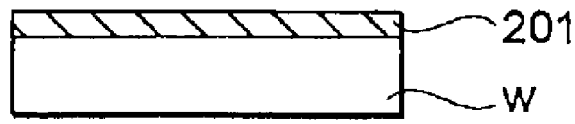
FIGS. 5A, 5B, 5C, and 5D are schematic diagrams showing semiconductor device fabrication processes according to an embodiment of the present invention.
Figure 5B:
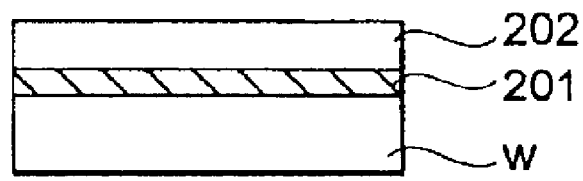
Figure 5C:
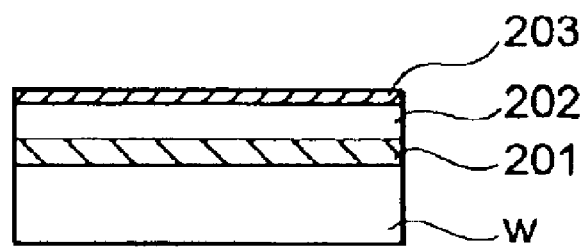
Figure 5D:
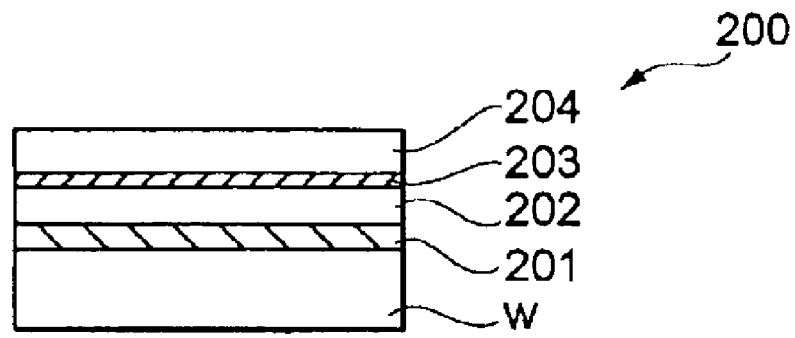

As shown in FIG. 5D, a lower layer wiring 201 is formed on a semiconductor wafer W (hereinafter abbreviated as wafer W). On the lower layer wiring 201, an inter-layer insulation film composed of layers of laminated films is formed. The inter-layer insulation film is composed of a porous insulation film 202, a non-porous insulation film 203, and a porous insulation film 204. A porous insulation film is a film made with processing a foaming material. In the inter-layer insulation film, for example through-holes (not shown) are formed. Via the through-holes, a wiring (not shown) that is made of a conductive material and formed on the inter-layer insulation film and the lower layer wiring 201 are connected.

As the porous insulation films 202 and 204, for example a porous MSQ material can be used. On the other hand, as the non-porous insulation film 203, an organic material such as PAE (poly arylene ether) can be used.

When a porous insulation film is used as the inter-layer insulation film, a high insulating characteristic can be achieved. For example, in the foregoing structure, a capacitance formed between the lower layer wiring 201 and the wiring formed on the inter-layer insulation film can be reduced.

Figure 1:
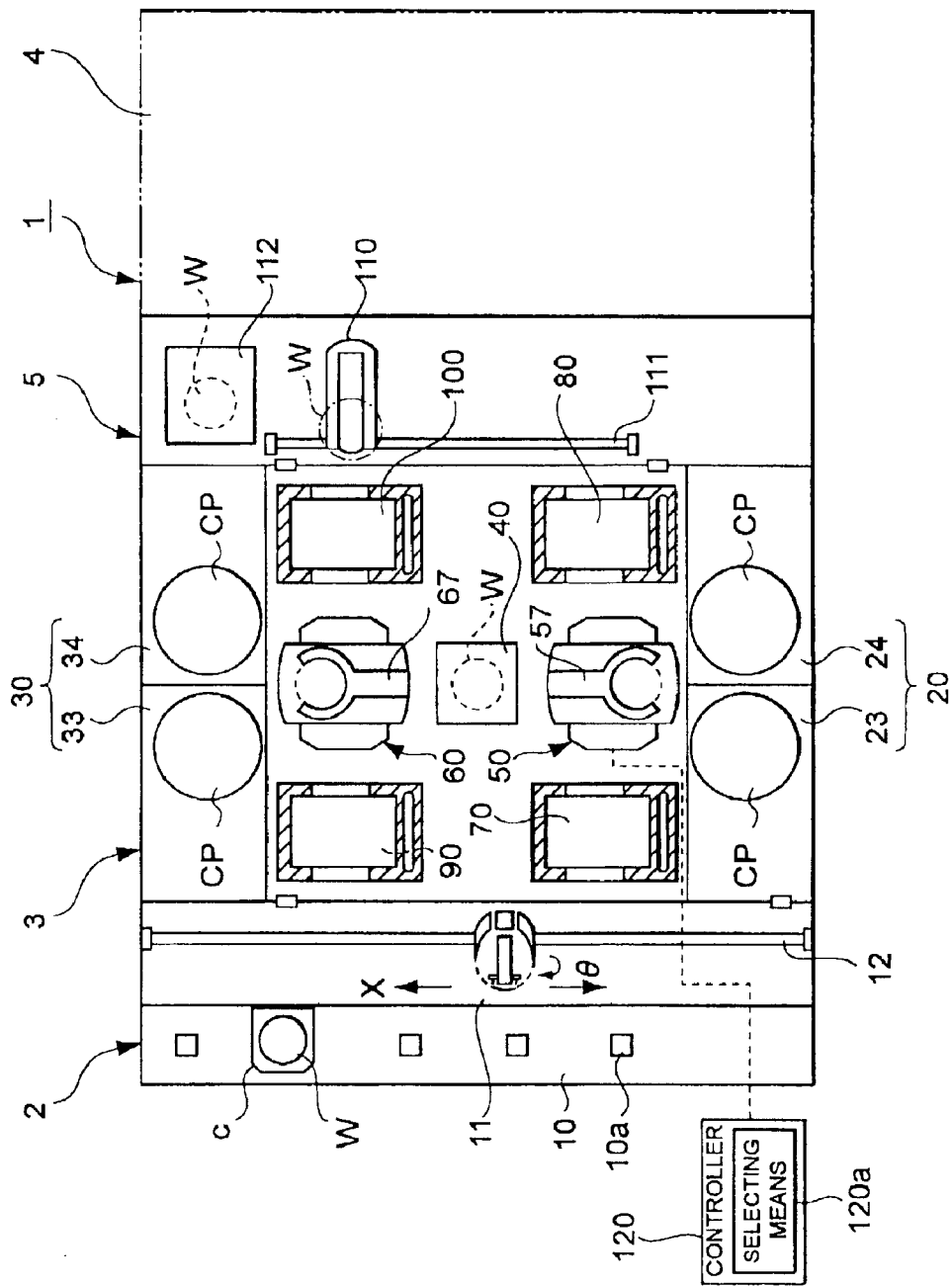
FIG. 1 is a plan view of a film forming apparatus according to an embodiment of the present invention.
Figure 2:
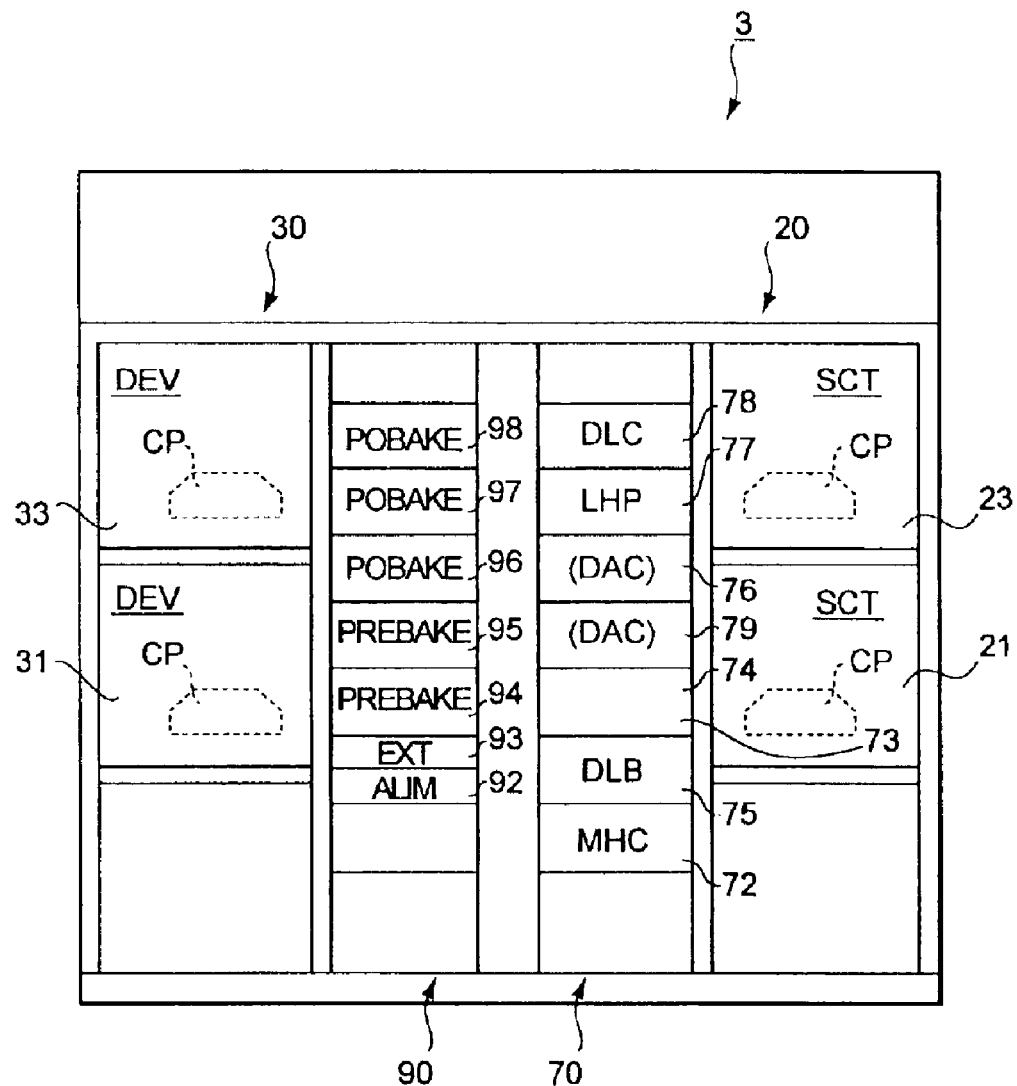
FIG. 2 is a side view of the film forming apparatus shown in FIG. 1.
Figure 3:
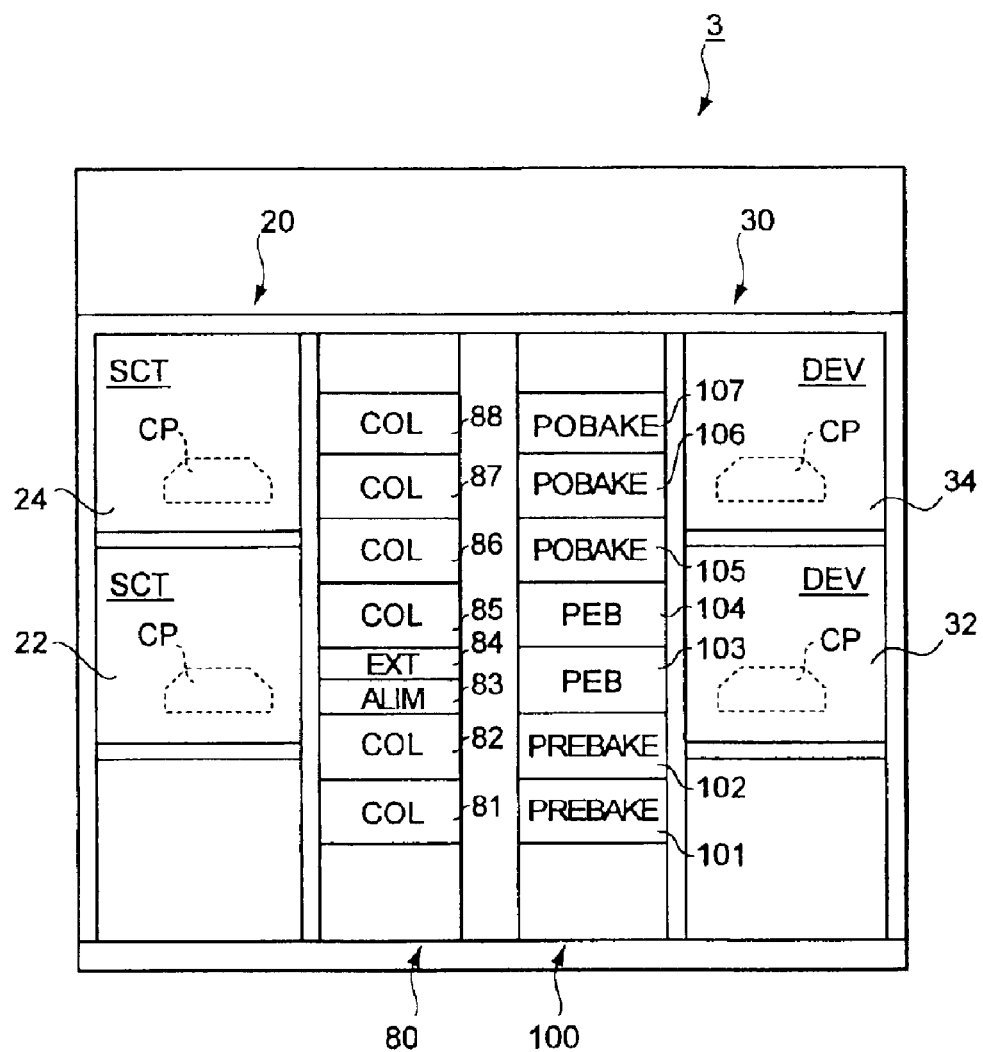
FIG. 3 is a side view showing the other side of the film forming apparatus shown in FIG. 1.
Figure 4:
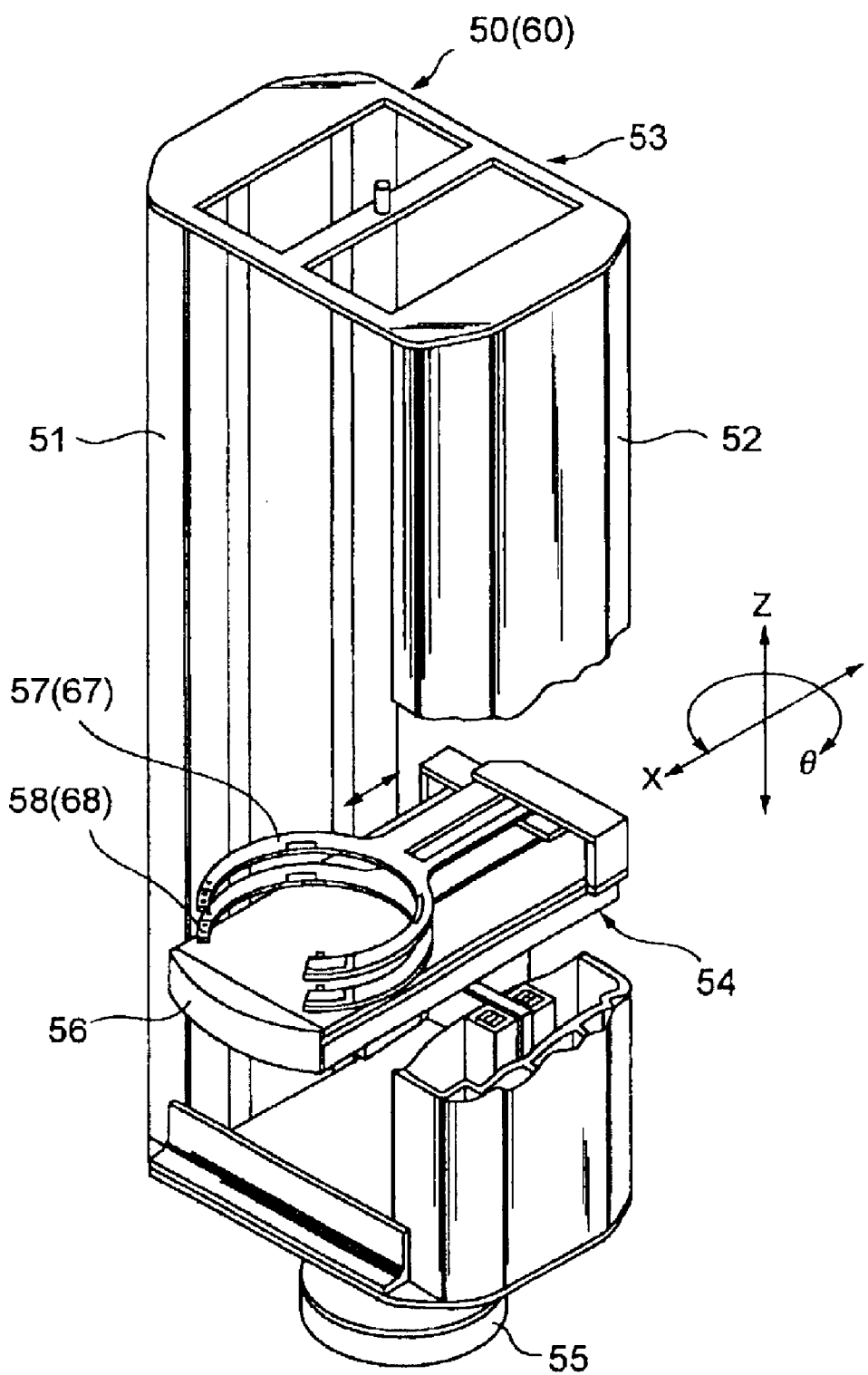
FIG. 4 is a perspective view showing a transfer mechanism of the film forming apparatus shown in FIG. 1.

FIGS. 1 to 4 are external views showing a film forming apparatus used to form the foregoing insulation films of the semiconductor device. FIG. 1 is a plan view showing the film forming apparatus. FIGS. 2 and 3 are side views showing the film forming apparatus.

The film forming apparatus is designated by reference numeral 1. The film forming apparatus 1 is composed of a cassette station 2, a processing station 3, an aligner 4, and an interface portion 5 that are integrally connected. The cassette station 2 is used to transfer a cassette C that contains for example 25 wafers W from the outside to the film forming apparatus 1. In addition, the cassette station 2 loads and unloads wafers with a cassette C. The processing station 3 has various types of processing apparatuses that are stacked in multiple stages. The aligner 4 is disposed adjacent to the processing station 3. The interface portion 5 is used to transfer a wafer W between the processing station 3 and the aligner 4.

In the cassette station 2, a plurality of cassettes C can be aligned at positions of assignment protrusions 10a on a cassette holding table 10 in an X direction (in the upper and lower direction of FIG. 1) in such a manner that wafer access portions of the cassettes C face the processing station 3. A wafer transfer mechanism 11 can travel in the direction of which the cassettes C are aligned (X direction) and the direction of which wafers W are contained in each cassette C (Z direction: vertical direction). The wafer transfer mechanism 11 can travel along a transferring path 12. Thus, the wafer transfer mechanism 11 can selectively access each cassette C.

Moreover, the wafer transfer mechanism 11 can rotate in a θ direction shown in FIG. 1. Thus, the wafer transfer mechanism 11 can access an extension unit (EXT) 74 and an extension unit (EXT) 93. The extension unit (EXT) 74 transfers the wafer W between a wafer transfer mechanism 11 of a multi-staged unit portion of a first processing apparatus group 70 and a first transfer mechanism 50 that will be described later. The extension unit (EXT) 93 transfers the wafer W between a wafer transfer mechanism 11 of a fourth processing apparatus group 90 and a second transfer mechanism 60 that will be described later.

In addition, a controller 120 is disposed on the cassette holding table 10. The controller 120 has a selecting means 120a for selecting a processing apparatus to which the first transfer mechanism 50 that will be described later transfers the wafer W corresponding to a film formed on the wafer W conveyed to the film forming apparatus 1. For example, information on to which path the transfer mechanism 50 should follow when transferring the wafer W to one of the above-mentioned apparatuses is pre-input to the selecting means 120a.

On the front side of the processing station 3, a first coating apparatus group 20 composed of a material coating apparatus, a resist coating apparatus, and an exchange coating apparatus are disposed. On the rear side of the processing station 3, a second coating apparatus group 30 composed of developing process apparatuses is disposed.

As shown in FIGS. 2 and 3, in the first coating apparatus group 20, a resist coating apparatuses 22 and 24 are stacked. In the first coating apparatus group 20, a foaming insulation film material coating apparatus 23 as a first coating apparatus and a non-foaming insulation film material coating apparatus 21 as a second coating apparatus are also stacked. The resist coating apparatus 24 places a wafer W on a spin chuck in a cup CP and coats a resist solution on the wafer W with spin coat process. In such a manner, the resist coating apparatus 24 performs a resist coating process for the wafer W. The foaming insulation film material coating apparatus 23 places a wafer W on a spin chuck in a cup CP and coats a foaming insulation film material as a foaming material with the spin coat process. In this example, a porous MSQ material is coated. In such a manner, the foaming insulation film material coating apparatus 23 performs the foaming insulation film material coating process for the wafer W. The non-foaming insulation film material coating apparatus 21 places a wafer W on a spin chunk in a cup CP and coats a non-foaming insulation film material as an insulation material with the spin coat process. In this example, an organic material such as PAE is coated. In such a manner, the non-foaming insulation film material coating apparatus 21 performs the non-foaming insulation film coating process for the wafer W.

As shown in FIGS. 2 and 3, in the second coating apparatus group 30, developing process apparatuses 33 and 31 and developing process apparatuses 34 and 32 are stacked. Each of the developing process apparatuses 31 to 34 places a wafer W on a spin chuck in a cup CP, supplies a developing solution, and performs a developing process for the wafer W.

At a center portion of the processing station 3, a transferring table 40 on which a wafer W can be placed is disposed.

The first coating apparatus group 20 and the second coating apparatus group 30 are oppositely disposed with the transferring table 40. The first transfer mechanism 50 as a transferring means is disposed between the first coating apparatus group 20 and the transferring table 40. The second transfer mechanism 60 is disposed between the second coating apparatus group 30 and the transferring table 40.

The structure of the first transfer mechanism 50 is basically the same as the structure of the second transfer mechanism 60. For simplicity, only the structure of the first transfer mechanism 50 will be described with reference to FIG. 4. The first transfer mechanism 50 is composed of a cylindrical supporting member 53 and a wafer transferring means 54. The cylindrical supporting member 53 is composed of a pair of wall portions 51 and 52 that are oppositely disposed and connected at the top and bottom. The wafer transferring means 54 is disposed in the cylindrical supporting member 53. The wafer transferring means 54 can lift up and down in an upper and lower direction (Z direction). The cylindrical supporting member 53 is connected to a rotating shaft of a motor 55. A rotating and driving force of the motor 55 causes the cylindrical supporting member 53 to rotate together with the wafer transferring means 54 around the rotating shaft of the motor 55. Thus, the wafer transferring means 54 can rotate freely in the θ direction.

On a transfer base 56 of the wafer transferring means 54, a plurality of pairs of tweezers are disposed as holding members that hold the wafer W. For example, two pairs of tweezers 57 and 58 are disposed as a pair of upper tweezers and a pair of lower tweezers. The structure of the pair of tweezers 57 is basically the same as the structure of the pair of tweezers 58. The pairs of tweezers 57 and 58 have a shape and a size that allow them to freely enter the side opening portions of the wall portions 51 and 52 of the cylindrical supporting member 53. The pairs of tweezers 57 and 58 can travel in a forward and backward direction by a motor (not shown) disposed in the transfer base 56. Likewise, the second transfer mechanism 60 has two pairs of tweezers 67 and 68 each pair of which has the same function and structure as each pair of the tweezers 57 and 58.

A first processing apparatus group 70 and a second processing apparatus group 80 are oppositely disposed with the first transfer mechanism 50 so that the first processing apparatus group 70 and the second processing apparatus group 80 are disposed in the vicinity of the first coating apparatus group 20. In the first processing apparatus group 70, a variety of types of apparatuses are stacked on multiple stages. The fourth processing apparatus group 90 and a third processing apparatus group 100 are oppositely disposed with the second transfer mechanism 60 so that the fourth processing apparatus group 90 and the third processing apparatus group 100 are disposed in the vicinity of the second coating apparatus group 30.

The first processing apparatus group 70 and the fourth processing apparatus group 90 are disposed adjacent to the cassette station 2. The second processing apparatus group 80 and the third processing apparatus group 100 is disposed adjacent to the interface portion 5.

Next, with reference to FIG. 2 that shows the processing station 3 viewed from the cassette station 2, the structure of the first processing apparatus group 70 and the fourth processing apparatus group 90 will be described.

In the first processing apparatus group 70, a low oxygen heating temperature regulating process apparatus (MHC) 72 as a first heating apparatus, a low oxygen high temperature heating process apparatus (DLB) 75 as a second heating apparatus, an alignment unit (ALIM) 73, an extension unit (EXT) 74, a low temperature heating processing apparatus (LHP) 77, and a low oxygen curing and cooling processing apparatus (DLC) 78 are stacked in order from the bottom to the top. The alignment unit (ALIM) 73 aligns a wafer W. The extension unit (EXT) 74 causes a wafer W to wait for the next process.

In the fourth processing apparatus group 90, an alignment unit (ALIM) 92, an extension unit (EXT) 93, pre-baking units (PREBAKE) 94 and 95, and post-baking units (POBAKE) 96, 97, and 98 are stacked in order from the bottom to the top. The pre-baking units (PREBAKE) 94 and 95 perform a heating process for a wafer W after a resist has been coated for the wafer W. The post-baking units (POBAKE) 96, 97, and 98 perform a heating process for a wafer W after a developing process has been performed for the wafer W.

Next, with reference to FIG. 3 that shows the processing station 3 viewed from the interface portion 5, the structure of the second processing apparatus group 80 and the third processing apparatus group 100 will be described.

In the second processing apparatus group 80, cooling units (COL) 81 and 82, an alignment unit (ALIM) 83, an extension unit (EXT) 84, and cooling units (COL) 85, 86, 87, and 88 are stacked in order from the bottom to the top.

In the third processing apparatus group 100, pre-baking units (PREBAKE) 101 and 102, post-exposure baking units (PEB) 103 and 104, and post-baking units (POBAKE) 105, 106, and 107 are stacked in order from the bottom to the top. The post-exposure baking units (PEB) 103 and 104 perform a heating process for a wafer W after an exposing process is performed for the wafer W.

In the interface portion 5, a wafer transfer mechanism 110 is disposed. The wafer transfer mechanism 110 can access the extension unit (EXT) 84 of the second processing apparatus group 80 and the post-exposure baking units (PEB) 103 and 104 of the third processing apparatus group 100.

The wafer transfer mechanism 110 can travel along a rail 111 in the X direction, lift up and down in the Z direction (the vertical direction of FIG. 1), and rotate in the θ direction. The wafer transfer mechanism 110 can transfer a wafer W to the aligner 4 and a peripheral aligner 112.

The foaming insulation film material coating apparatus 23 as the first coating apparatus and the non-foaming insulation film material coating apparatus 21 as the second coating apparatus perform a coating process by the spin coat process and almost have the same structure.

Figure 8:
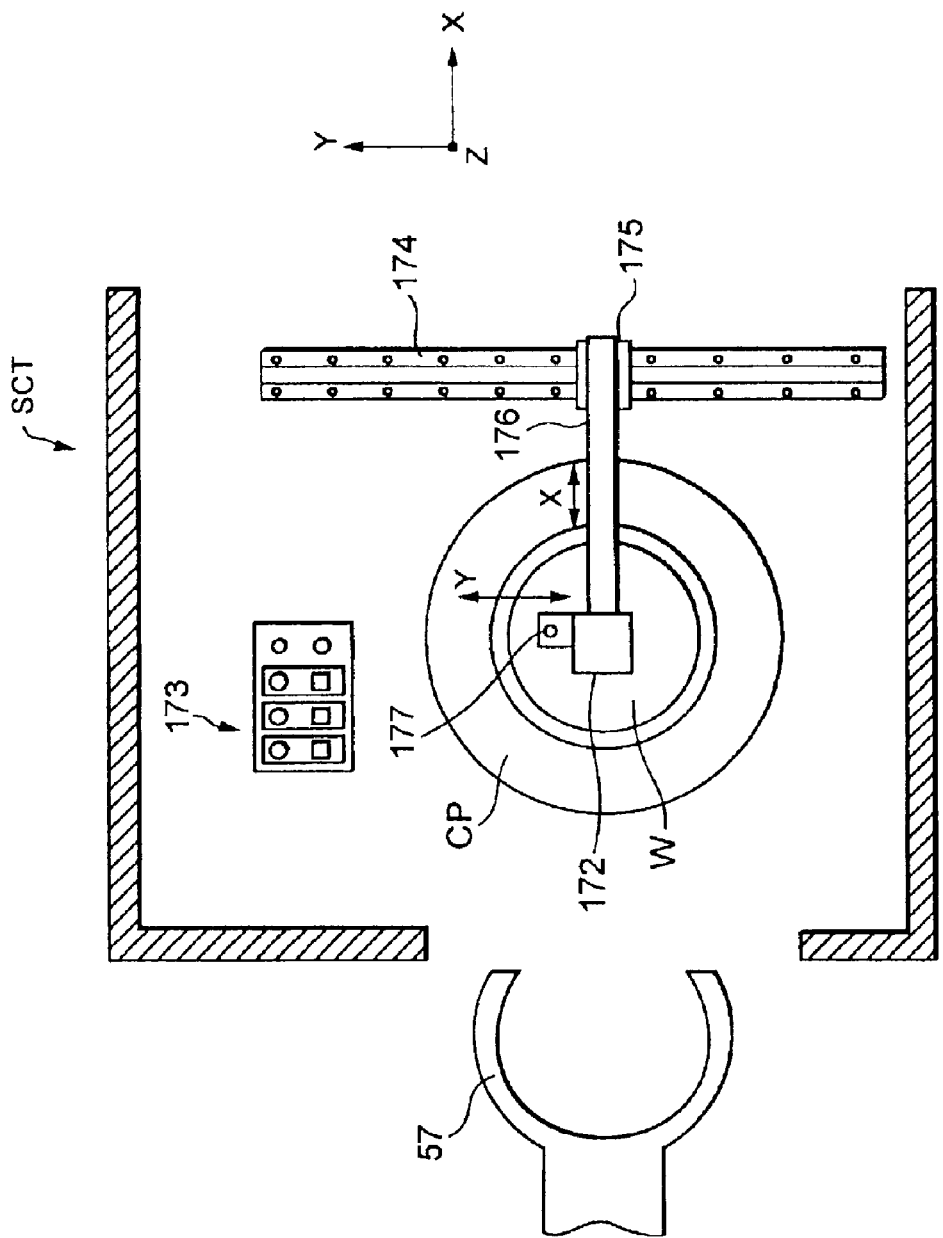
FIG. 8 is a sectional view showing a coating apparatus (SCT).
Figure 9:
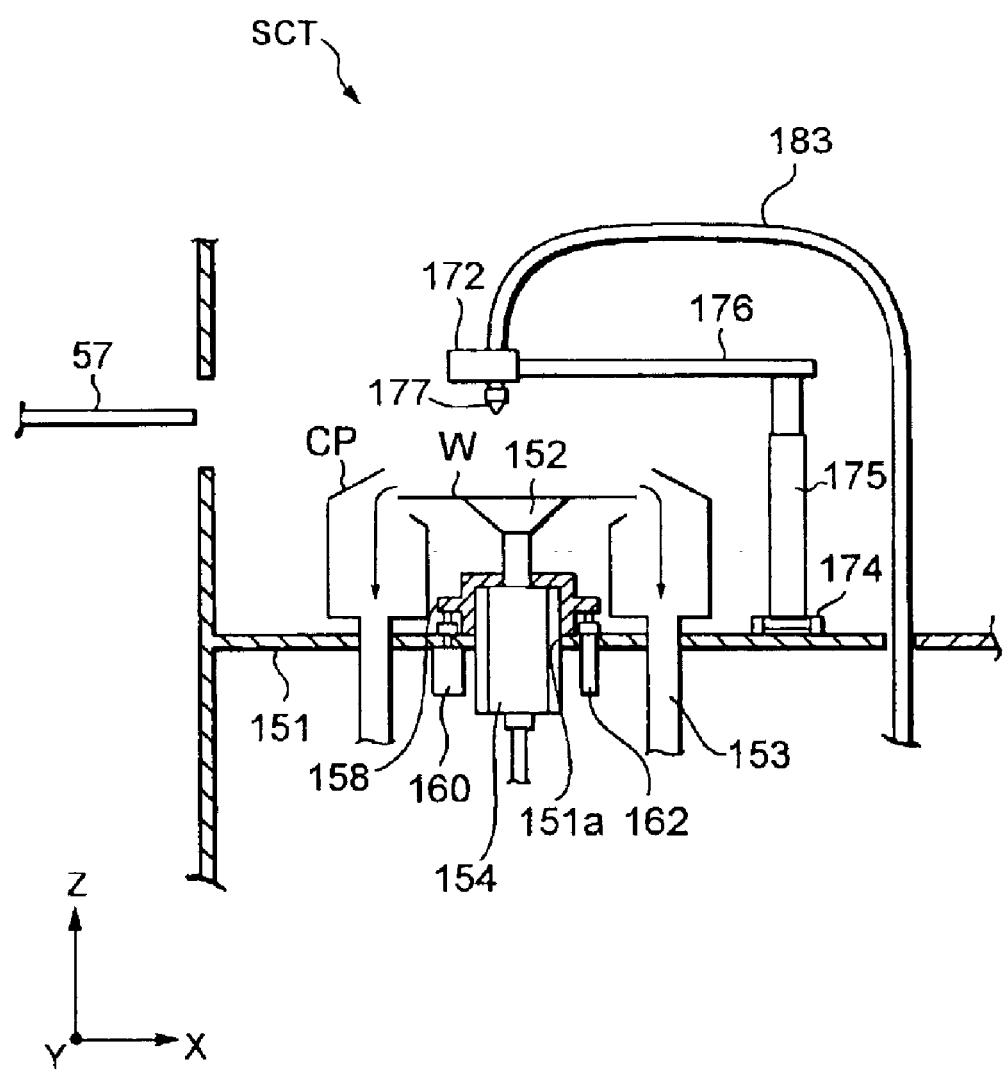
FIG. 9 is a plan view showing the coating apparatus (SCT).

FIGS. 8 and 9 are a sectional view and a plan view showing these coating apparatuses (SCT), respectively. A ring-shaped cup CP is disposed at a center portion of the coating apparatus (SCT). The cup CP has a drainage pipe 153. A spin chuck 152 is disposed inside the cup CP. While the spin chuck 152 is holding a semiconductor wafer W by the vacuum absorption method, the spin chuck 152 is rotated and driven by a drive motor 154. The drive motor 154 is disposed so that it can lift up and down at an opening 151a of a unit bottom plate 151. The drive motor 154 is connected to a lifting driving means 160 and a lifting guiding means 162 through a cap-shaped flange member 158 made of aluminum. The lifting driving means 160 is composed of for example an air cylinder.

A supply pipe 183 is connected from an insulation film material supply source (not shown) to the nozzle 177. The nozzle 177 is detachably disposed at an edge portion of a nozzle scan arm 176 through a nozzle holding member 172. The nozzle scan arm 176 is disposed at an upper edge portion of a vertical holding member 175. The vertical holding member 175 can horizontally travel on a guide rail 174 disposed in one direction (Y direction) of the unit bottom plate 151. The nozzle scan arm 176 moves together with the vertical holding member 175 in the Y direction in a Y direction by a driving mechanism (not shown).

Next, the low oxygen heating temperature regulating process apparatus (MHC) 72 as the first heating apparatus and the low oxygen high temperature heating process apparatus (DLB) 75 as the second heating apparatus will be described.

Figure 10:
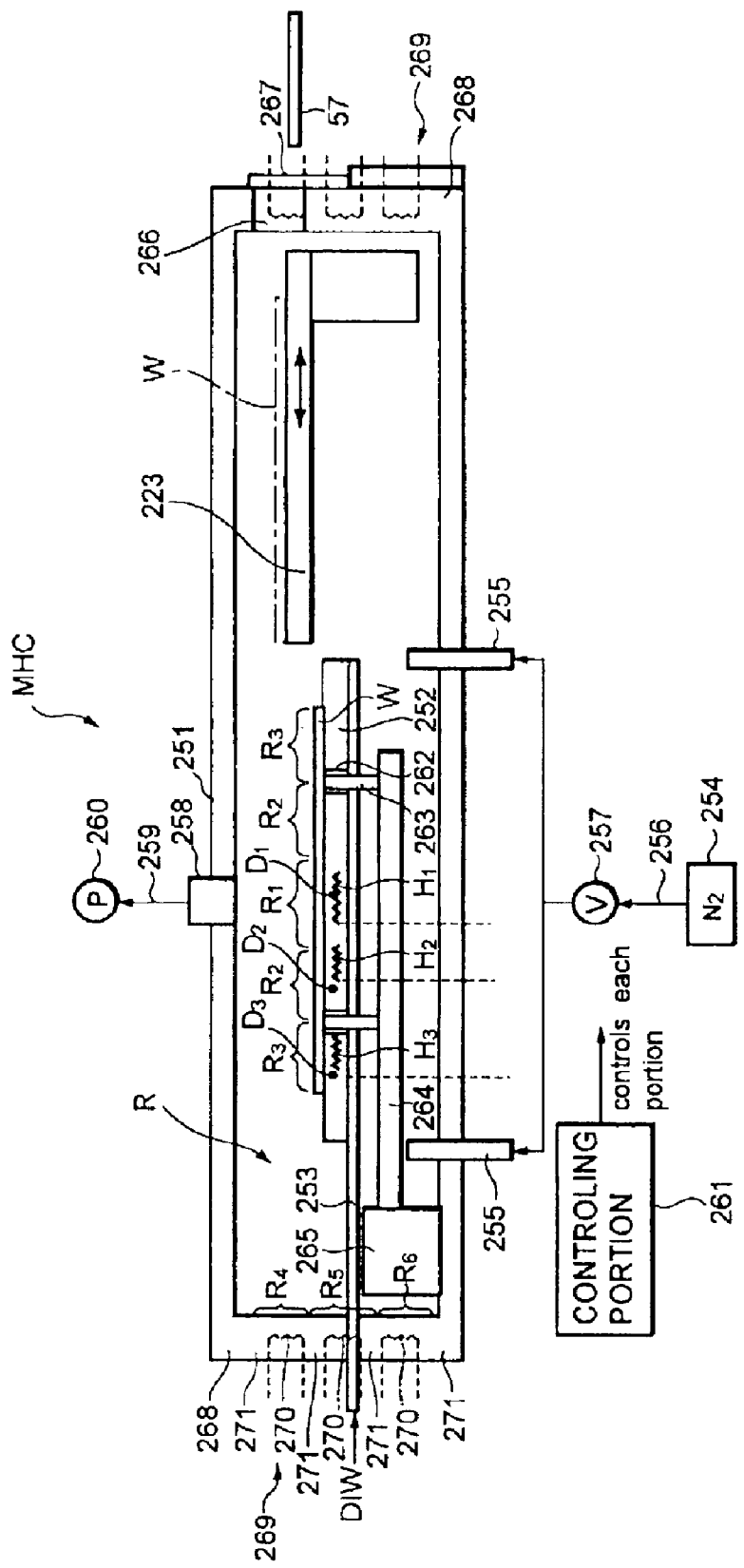
FIG. 10 is a front sectional view showing a low oxygen heating temperature regulating process apparatus (MHC).
Figure 12:
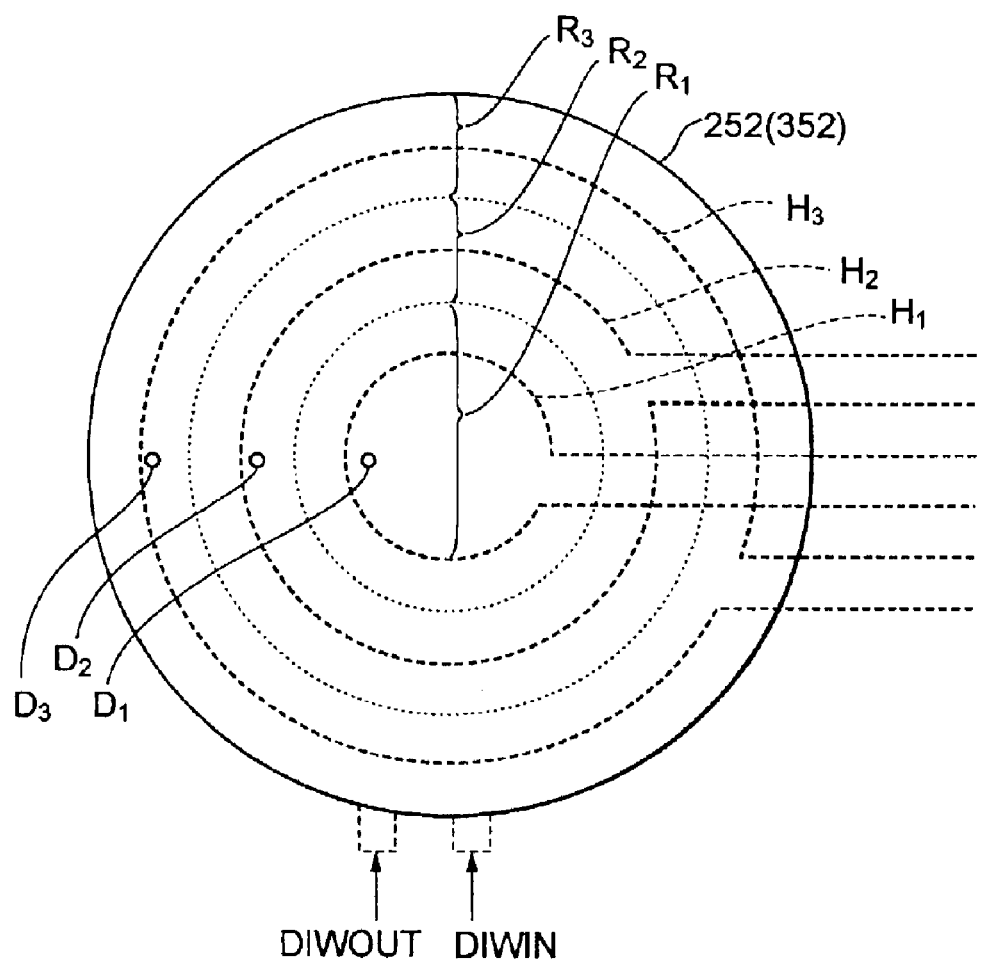
FIG. 12 is a partial plan view showing the low oxygen heating temperature regulating process apparatus (MHC) and the low oxygen high temperature heating process apparatus (DLB).

FIG. 10 is a front sectional view showing the low oxygen heating temperature regulating process apparatus (MHC) as the first heating apparatus. FIG. 12 is a partial plan view showing the low oxygen heating temperature regulating process apparatus (MHC). The low oxygen heating temperature regulating process apparatus (MHC) is an apparatus that performs a heating process for a foaming insulation film material coated on a wafer W.

In a processing chamber 251 of the low oxygen heating temperature regulating process apparatus (MHC), a plate 252 and an arm 223 are disposed. The plate 252 is used to perform a heating process for a wafer W at for example 200 to 800° C. The arm 223 transfers the wafer W between the first transfer mechanism 50 and the plate 252. The arm 223 receives the wafer W from the pair of tweezers 57 of the first transfer mechanism 50 and transfers the wafer W to the plate 252. The arm 223 has a cooling mechanism. The wafer W heated on the plate 252 is cooled on the arm 223. Thereafter, the wafer W is transferred to the pair of tweezers 57 of the first transfer mechanism 50. The plate 252 is made of the same material as the wafer W. When a wafer W is made of silicon, the plate 252 is also made of silicon. As a result, when a heating process is performed for the wafer W, a heat reflection between the wafer W and the plate 252 can be suppressed. Thus, in the heating process that will be described later, the temperature of the wafer W can be accurately measured. The volume of the plate 252 is almost equal to the volume of the wafer W. Thus, the heat capacity applied to the plate 252 can accurately be calculated for controlling the temperature. Alternatively, the volume of the plate 252 may be different from the volume of the wafer W. For example, the volume of the plate 252 may be a multiple of the volume of the wafer W. As long as the temperature of the plate 252 can easily be controlled, the volume thereof can be changed. According to the embodiment, the plate 252 is designed so that its thickness is lower than the thickness of a plate disposed in the low oxygen high temperature heating process apparatus (DLB) as the second heating apparatus that will be described later. Thus, in comparison with the plate of the low oxygen high temperature heating process apparatus (DLB), the heat capacity of the plate 252 can be decreased. As a result, the temperature of the plate 252 can be controlled in a short time. Thus, the temperature of the heating process for a wafer W can be easily varied corresponding to the material of a film formed thereon. In other words, when a coated foaming insulation film material is heated and a porous insulation film is formed, there are many opportunities of which the temperature condition is changed. Thus, in such a structure, the processes can be effectively performed.

The plate 252 is peripherally divided into three areas R1 to R3. For each of the divided three areas R1 to R3, the temperature control is performed. In other words, heaters H1 to H3 are concentrically buried in the areas R1 to R3 of the plate 252, respectively. In addition, temperature detecting devices D1 to D3 are buried in the areas R1 to R3 of the plate 252, respectively. In addition, a cooling pipe 253 that cools the plate 252 is disposed on the rear surface of the plate 252. In the cooling pipe 253, a liquid for example demineralized water that has been cooled at for example 15° C. to 23° C. is circulated through a freezer (not shown). With such a cooling means, the temperature of the plate 252 can quickly be lowered. In addition to the heaters H1 to H3, the temperature control for the plate 252 can accurately and quickly be performed. With a plurality of heaters, for example three, the plate 252 is area-controlled. In contrast, with the cooling pipe 253 as a cooling means, the plate 252 is not area-controlled. As a result, while the temperature control is accurately accomplished, the structure is simplified. Of course, with the cooling means, the cooling pipe 253 can also be area-controlled. As the heating means, an infrared ray or the like can be used instead of heaters. As the cooling means, a Peltier device or the like can be used.

At a lower portion of the processing chamber 251, a $N_2$ supply opening 255 is disposed. The $N_2$ supply opening 255 discharges $N_2$ gas supplied from an $N_2$ source 254 to the processing chamber 251. A pipe 256 is connected between the $N_2$ source 254 and the $N_2$ supply opening 255. A valve 257 is disposed on the pipe 256. The valve 257 adjusts the discharge amount of the $N_2$ supply opening 255. Alternatively, a means for heating and cooling $N_2$ gas may be disposed on the pipe 256 so as to adaptively control the temperature of the $N_2$ gas.

In addition, at an upper portion of the processing chamber 251, an exhaust opening 258 is disposed. The exhaust opening 258 deaerates the processing chamber 251 by the vacuum exhaust method. A vacuum pump 260 is connected to the exhaust opening 258 through a pipe 259.

A controlling portion 261 estimates the temperature of the heating process for the wafer W corresponding to the detected results of the temperature detecting devices D1 to D3. Corresponding to the estimated temperature, the controlling portion 261 controls powers supplied to the heaters H1 to H3 so that the temperatures of the areas R1 to R3 become predetermined temperatures. When necessary, the controlling portion 261 also controls the temperature and amount of the liquid supplied to the cooling pipe 253. When necessary, the controlling portion 261 controls the discharging amount of the $N_2$ gas and the degree of vacuum of the chamber.

A plurality of holes 262, for example three, concentrically pierce the plate 252. Support pins 263 that support a wafer W are inserted into the holes 262 so that the support pins 263 can lift up and down in the holes 262. The support pins 263 are integrally connected to a connecting member 264 disposed on the rear surface of the plate 252. The connecting member 264 is lifted up and down with a lifting cylinder 265 disposed below the connecting member 264. The lifting cylinder 265 causes the support pins 263 to protrude and recess from the front surface of the plate 252.

An opening portion 266 is disposed on the front surface of the processing chamber 251. Through the opening portion 266, a wafer W is transferred with the first transfer mechanism 50. The opening portion 266 can be closed with a shutter member 267. When the opening portion 266 is closed with the shutter member 267, the interior of the processing chamber 251 can be air-tightly closed and effectively deaerated.

A wall portion 268 that composes the processing chamber 251 and that surrounds an area R including the plate 252 has a temperature regulating mechanism 269 that adjusts the temperature of the area R. The temperature regulating mechanism 269 is composed of a heater 270 and a cooling pipe 271 that are buried in the wall portion 268. The controlling portion 261 controls the power supplied to the heater 270 and the temperature and amount of cooling water supplied to the cooling pipe 271. The temperature regulating mechanism 269 allows the temperature of the processing chamber 251 to be accurately controlled.

When the wall portion 268 is vertically divided into for example three areas R4 to R6 and they are separately controlled by the temperature regulating mechanism 269, not only the temperature, but the air flow in the processing chamber 251 can be controlled. For example, when the temperatures of the areas of the processing chamber 251 are controlled so that the temperature of the upper area becomes higher than the temperature of the lower area, an upward air flow is intentionally generated. As a result, a sublimate or the like that is produced from the wafer W can be securely exhausted to the outside (through for example the exhaust opening 258) without adversely affecting the wafer W. According to the embodiment, the wall portion of the outer periphery of the processing chamber 251 is controlled. Of course, the upper and lower wall portions can be controlled.

Figure 11:
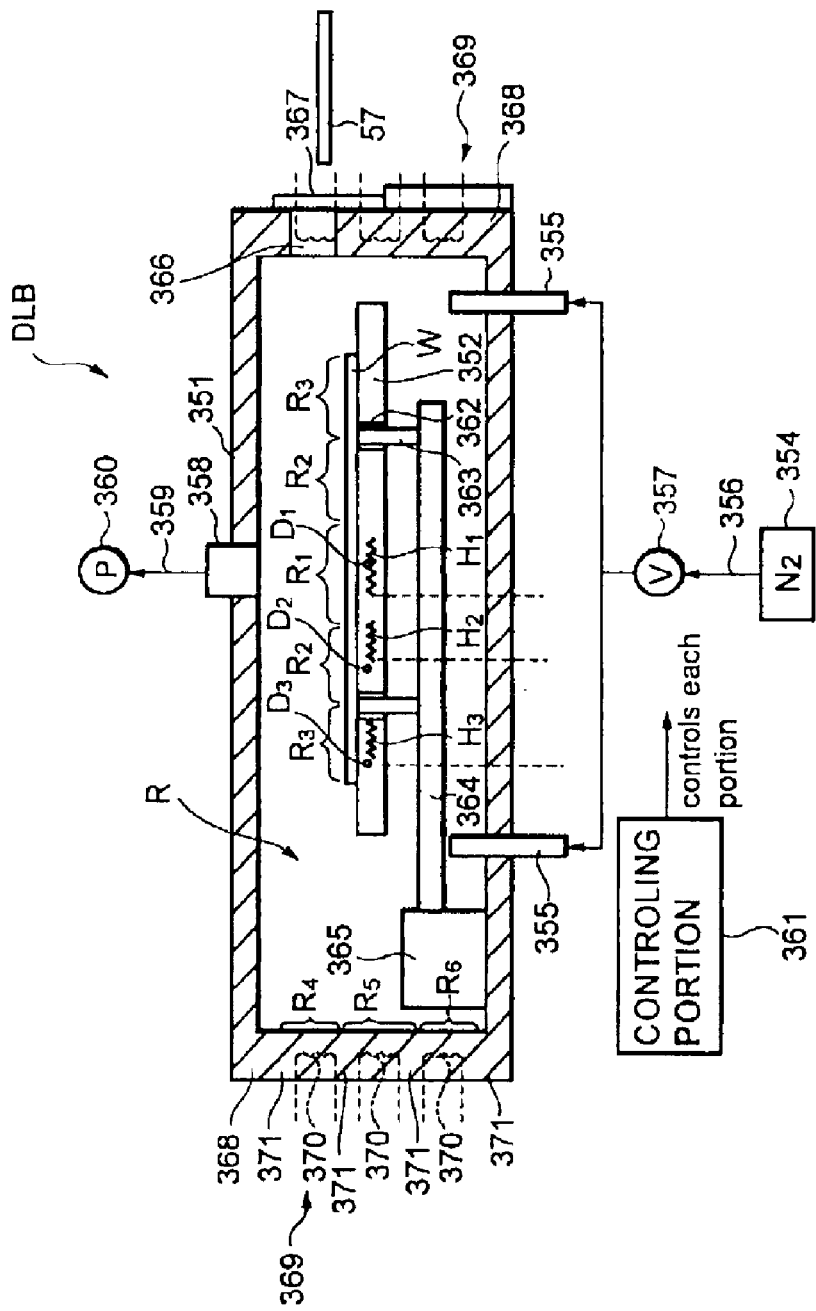
FIG. 11 is a front sectional view showing a low oxygen high temperature heating process apparatus (DLB).

FIG. 11 is a front sectional view showing the low oxygen high temperature heating process apparatus (DLB) as the second heating apparatus. FIG. 12 is a partial plan view showing the low oxygen high temperature heating process apparatus (DLB). The low oxygen high temperature heating process apparatus (DLB) is different from the forgoing low oxygen heating temperature regulating process apparatus (MHC) except that the former does not have the cooling mechanism of the plate 252 and the arm 223. The low oxygen high temperature heating process apparatus (DLB) is an apparatus that performs a heating process for a non-foaming insulation film material or a foaming insulation film material that is coated on a wafer W.

In a processing chamber 351 of the low oxygen high temperature heating process apparatus (DLB), a plate 352 used to perform a heating process for a wafer W at for example 200 to 800° C. is disposed. The plate 352 is made of the same material as a wafer W. When a wafer W is made of silicon, the plate 352 is also made of silicon. As a result, when a heating process is performed for a wafer W, a heat reflection between the wafer W and the plate 352 can be suppressed. Thus, in the heating process that will be described later, the temperature of the wafer W can be accurately estimated. The volume of the plate 352 is almost equal to the volume of the wafer W. Thus, the heat capacity applied to the plate 352 can be accurately calculated for controlling the temperature. However, the volume of the plate 352 may be different from the volume of the wafer W. For example, the volume of the plate 352 may be a multiple of the volume of the wafer W. Of course, as long as the temperature of the plate 352 can easily be controlled, the volume thereof can be changed.

The plate 352 is peripherally divided into three areas R1 to R3. For each of the divided three areas R1 to R3, the temperature control is performed. In other words, heaters H1 to H3 are concentrically buried in the areas R1 to R3 of the plate 352, respectively. In addition, temperature detecting devices D1 to D3 are buried in the areas R1 to R3 of the plate 352, respectively. As the heating means, an infrared ray or the like can be used instead of heaters.

At a lower portion of the processing chamber 351, a $N_2$ supply opening 355 is disposed. The $N_2$ supply opening 355 discharges N₂ gas supplied from an N₂ source 354 into the processing chamber 351. A pipe 356 is connected between the N₂ source 354 and the N₂ supply opening 355. A valve 357 is disposed on the pipe 356. The valve 357 adjusts the discharge amount of the N₂ supply opening 355. Alternatively, a means for heating and cooling N₂ gas may be disposed on the pipe 356 so as to adaptively control the temperature of the N₂ gas.

In addition, at an upper portion of the processing chamber 351, an exhaust opening 358 is disposed. The exhaust opening 258 deaerates the processing chamber 351 by the vacuum exhaust method. A vacuum pump 358 is connected to the exhaust opening 359 through a pipe 360.

A controlling portion 361 estimates the temperature of the heating process for the wafer W corresponding to the detected results of the temperature detecting devices D1 to D3. Corresponding to the estimated temperature, the controlling portion 361 controls powers supplied to the heaters H1 to H3 so that the temperatures of the areas R1 to R3 become predetermined temperatures. When necessary, the controlling portion 361 controls the discharging amount of the N₂ gas and the degree of vacuum of the chamber.

A plurality of holes 362, for example three, concentrically pierces the plate 352. Support pins 362 that support a wafer W are inserted into the holes 363 so that the support pins 263 can lift up and down through the holes 262. The support pins 363 are integrally connected to a connecting member 364 disposed on the rear surface of the plate 352. The connecting member 364 is lifted up and down with a lifting cylinder 365 disposed below the connecting member 264. The lifting cylinder 365 causes the support pins 363 to protrude and recess from the front surface of the plate 352.

An opening portion 366 is disposed on the front surface of the processing chamber 351. Through the opening portion 366, a wafer W is transferred with the first transfer mechanism 50. The opening portion 367 can be closed with a shutter member 367. When the opening portion 367 is closed with the shutter member 367, the interior of the processing chamber 351 can be air-tightly closed and effectively deaerated.

A wall portion 368 that composes the processing chamber 351 and that surrounds an area R including the plate 352 has a temperature regulating mechanism 369 that adjusts the temperature of the area R. The temperature regulating mechanism 369 is composed of a heater 370 and a cooling pipe 371 that are buried in the wall portion 368. The controlling portion 361 controls the power supplied to the heater 370 and the temperature and amount of cooling water supplied to the cooling pipe 371. The temperature regulating mechanism 369 allows the temperature of the processing chamber 351 to be accurately controlled. When the wall portion 368 is vertically divided into for example three areas R4 to R6 and they are separately controlled by the temperature regulating mechanism 369, not only the temperature, but the air flow in the processing chamber 351 can be controlled. For example, when the temperatures of the areas of the processing chamber 251 are controlled so that the temperature of the upper area becomes higher than the temperature of the lower area, an upward air flow is intentionally generated. As a result, a sublimate or the like that is produced from the wafer W can be securely exhausted to the outside (through for example the exhaust opening 358) without adversely affecting the wafer W. According to the embodiment, the wall portion of the outer periphery of the processing chamber 351 is controlled. Of course, the upper and lower wall portions can be controlled.

Figure 6:
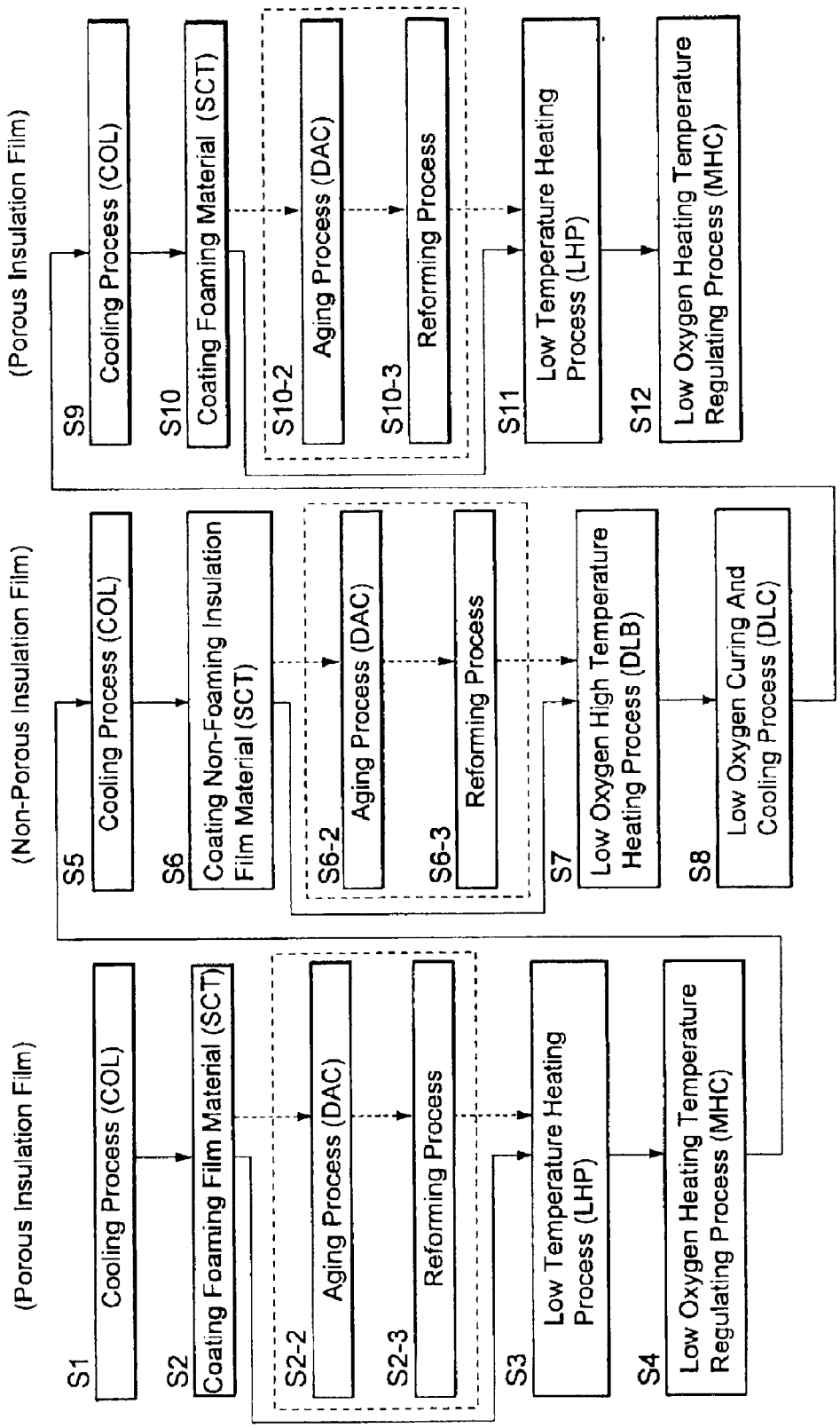
FIG. 6 is a flow chart showing the semiconductor device fabrication processes according to the embodiment of the present invention.

Next, with reference to FIGS. 5A, 5B, 5C, 5D, and 6, a fabrication method for an insulation film composed of a laminate of a semiconductor device using the foregoing film forming apparatus will be described. FIGS. 5A to 5D are schematic diagrams explaining fabrication processes for a semiconductor device. FIG. 6 is a flow chart showing fabrication processes for an insulation film of a laminate film using the foregoing film forming apparatus.

As shown in FIG. 5A, a wafer W on which a lower layer wiring 201 has been formed is prepared. The wafer W is placed in a cassette C on the cassette holding table 10. Thereafter, the operator inputs information of a film to be formed on the wafer W to the controller 120. According to the embodiment, information of an insulation film composed of three layers of a porous insulation film, a non-porous insulation film, and a porous insulation film to be formed on the wafer W is input to the controller 120. Corresponding to the input information, the controller 120 determines apparatuses to which the first transfer mechanism 50 transfers the wafer W and in what order. The first transfer mechanism 50 operates corresponding to the result. According to the embodiment, when a porous insulation film is formed, the controller 120 selects the foaming insulation film material coating apparatus (SCT) 23 as a coating apparatus and the low oxygen heating temperature regulating process apparatus (MHC) 72 as a heating apparatus as major apparatuses to which the wafer W is transferred. When a non-porous insulation film is formed, the controller 120 selects the non-foaming insulation film material coating apparatus (SCT) 21 as a coating apparatus and the low oxygen high temperature heating process apparatus (DLB) 75 as a heating apparatus as major apparatuses to which the wafer W is transferred. After the information is input, the wafer W that has not been processed is transferred from the wafer cassette CR placed on the cassette holding table 10 to the extension unit (EXT) 74 of the first processing apparatus group 70 that is adjacent to the processing station 3 through the wafer transfer mechanism 11.

The wafer W transferred to the transferring table of the extension unit (EXT) 74 is transferred to for example a cooling unit (COL) 81 of the second processing apparatus group 80 through the first transfer mechanism 50. The cooling unit (COL) 81 cools the wafer W to for example around 23° C. (at step S1).

The wafer W for which the cooling process has been performed by the cooling unit (COL) 81 is transferred to the foaming insulation film material coating apparatus (SCT) 23 of the first coating apparatus group 20 through the first transfer mechanism 50. The foaming insulation film material coating apparatus 23 coats a foaming material of for example around 500 nm on the wafer W with the spin coat process (at step S2). As a result, a foaming insulation material coating film is formed on the lower layer wiring 201 of the wafer W. In this example, as the foaming insulation film material, a porous MSQ material is used.

The wafer W on which the foaming insulation film material has been coated by the foaming insulation film material coating apparatus (SCT) 23 is transferred to the low temperature heating processing unit (LHP) 77 of the first processing apparatus group through the first transfer mechanism 50. The low temperature heating processing apparatus (LHP) 77 performs a low temperature heating process for the wafer W for 60 seconds at for example around 100° C. (at step S3).

The wafer W for which the low temperature heating process has been performed by the low temperature heating processing apparatus (LHP) 77 is transferred to the low oxygen heating temperature regulating process apparatus (MHC) 72 through the first transfer mechanism 50. The low oxygen heating temperature regulating process apparatus (MHC) 72 performs a high temperature hating process for the wafer W for 30 minutes at around 400° C. in an oxygen atmosphere of for example 1000 ppm or less so as to harden and reform the film quality of the foaming insulation film material coating film (at step S4). As a result, as shown in FIG. 5B, a porous insulation film 202 made of the porous MSQ material is formed on the lower layer wiring 201 of the wafer W. The heat quantity required for forming a porous insulation film is larger than the heat quantity required for forming a non-porous insulation film.

Thereafter, the wafer W processed by the low oxygen heating temperature regulating process apparatus (MHC) 72 is transferred to for example a cooling unit (COL) 82 of the second processing apparatus group through the first transfer mechanism 50. The cooling unit (CPL) 82 cools the wafer W to at around 23° C. (at step S5).

The wafer W for which the cooling process has been performed by the cooling unit (COL) 82 is transferred to the non-foaming insulation film material coating apparatus (SCT) 21 of the first coating apparatus group 20 through the first transfer mechanism 50. The non-foaming insulation film material coating apparatus (SCT) 21 coats a non-foaming insulation film material of for example around 200 nm on the wafer W (at step S6). As a result, a non-foaming insulation film material coated film is formed on the porous insulation film 202. In this example, as the non-foaming insulation film material, PAE material is used.

The wafer W on which the non-foaming insulation film material has been coated by the non-foaming insulation film material coating apparatus (SCT) 21 is transferred to the low oxygen high temperature heating process apparatus (DLB) 75 through the first transfer mechanism 50. The low oxygen high temperature heating process apparatus (DLB) 75 performs a high temperature heating process for the wafer W for around 60 seconds or less at for example around 300° C. in a low oxygen atmosphere (at step S7).

The wafer W for which the high temperature heating process has been performed by the low oxygen high temperature heating process apparatus (DLB) 75 is transferred to the low oxygen curing and cooling processing apparatus (DLC) 78 through the first transfer mechanism 50. The low oxygen curing and cooling processing apparatus (DLC) 78 performs a high temperature heating process for the wafer W for around five minutes at for example around 450° C. in a low temperature atmosphere so as to harden and reform the quantity of the non-foaming insulation material coated film. Thereafter, the low oxygen curing and cooling processing apparatus (DLC) 78 performs a cooling process for the wafer W at around 23° C. (at step S8). As a result, as shown in FIG. 5C, a porous insulation film 203 is formed on the porous insulation film 202.

The wafer W processed by the low oxygen curing and cooling processing apparatus (DLC) 78 is transferred to for example the cooling unit (COL) 85 of the second processing apparatus group 80 through the first transfer mechanism 50. The cooling unit (COL) 85 cools the wafer W to for example around 23° C. (at step S9).

The wafer W for which the cooling process has been performed by the cooling unit (COL) 85 is transferred to the foaming insulation film material coating apparatus (SCT) 23 of the first coating apparatus group 20 through the first transfer mechanism 50. The foaming insulation film material coating apparatus (SCT) 23 coats a foaming insulation film material of for example around 500 nm on the wafer W by the spin coat process (at step S10). A foaming insulation film material coated film is formed on the lower layer wiring 201 of the wafer W. In this example, as the foaming insulation film material, a porous MSQ material is used.

The wafer W on which the foaming insulation film material has been coated by the foaming insulation film material coating apparatus (SCT) 23 is transferred to the low temperature heating processing apparatus (LHP) 77 of the first processing apparatus group through the first transfer mechanism 50. The low temperature heating processing apparatus (LHP) 77 performs a low temperature heating process for the wafer W for around 60 seconds at for example 100° C. (at step S11).

The wafer W for which the low temperature heating process has been performed by the low temperature heating processing apparatus (LHP) 77 is transferred to the low oxygen heating temperature regulating process apparatus (MHC) 72 through the first transfer mechanism 50. The low oxygen heating temperature regulating process apparatus (MHC) 72 performs a high temperature heating process for the wafer W for around 30 minutes at around 400° C. in an oxygen atmosphere of for example 1000 ppm or below (at step S12). As a result, as shown in FIG. 5D, a porous insulation film 204 made of an MSQ structure or organic/inorganic (silica) structure is formed on the non-porous insulation film 203. As a result, a laminate film of which the porous insulation film 202, the non-porous insulation film 203, and the porous insulation film 204 that are layered in order can be accomplished.

Figure 13:
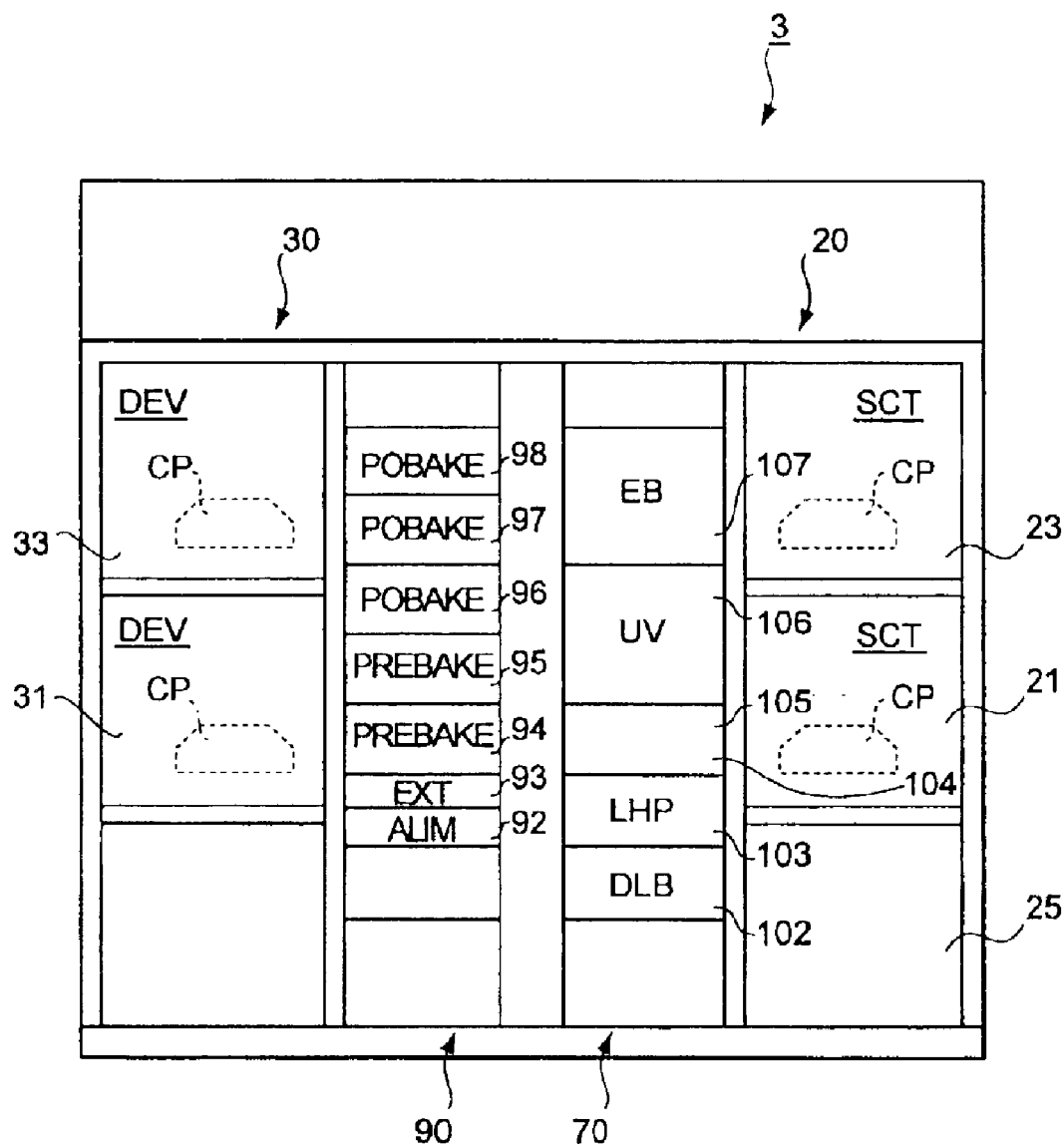
FIG. 13 is a side view showing a film forming apparatus according to another embodiment of the present invention.

In addition, so that after the porous insulation film 202 and/or the non-porous insulation film 203 is formed, the film quality thereof is reformed and the adhesion of the front surface of the insulation film is improved, an ultraviolet ray may be radiated onto the insulation film by an ultraviolet ray radiation unit (UV) 106 as shown in FIG. 13. By the reforming process, not only the adhesion, but the water absorption of the front surface of the film is improved. As a result, the film has a hydrophilic property. Thus, the contact angle of the non-porous insulation film material to the porous insulation film becomes small. As a result, the non-porous material can be easily coated. In other words, when the porous insulation material is spread on the wafer by the spin coat process, the porous insulation material can easily be spread and flattened. In addition, since the material can easily be spread, the required amount of the material can be reduced.

In addition, after a ultraviolet ray is radiated, a solvent such as thinner may be equally coated on the insulation film with the spin coat process. Thus, not only the non-porous insulation material can easily be spread on the porous insulation film, but the required amount of the material can be reduced.

In addition, according to the forgoing embodiment, the low oxygen heating temperature regulating process apparatus (MHC) 72 is disposed so as to harden and reform the film quality of a foaming insulation film material. In addition, the low oxygen curing and cooling processing apparatus (DLC) 78 is disposed so as to harden and reform the film quality of a non-foaming insulation film material. Alternatively, when an electron radiation curing processing apparatus (EB) 108 as shown in FIG. 13 is disposed, the film quality of each film can be hardened and refined. As a result, the first coating apparatus group 20 and the second coating apparatus group 30 can be prevented from being adversely affected by heat.

In addition, according to the forgoing embodiment, as shown in FIG. 6, a foaming material is coated (at step S2 or S10) and a low temperature heating process is performed (at step S3 or S11). However, depending on a chemical (for example, porous HSQ material) used as a foaming material, an aging process (at step S2-2 or S10-2) and a reforming process (at step S2-3 or S10-3) (processed by a processing apparatus at a position designated by reference numeral 25 of FIG. 13) may be performed between the formed material coating process and the low temperature heating process. Likewise, depending on a chemical used as a non-foaming material, an aging process (at step S6-2) and a reforming process (at step S6-3) may be performed between the non-foaming material coating process and the low oxygen high temperature heating process. The aging process is performed by aging processing apparatuses (DAC) 76 and 79.

In the aging processing apparatuses (DAC) 76 and 79, a mixture of ammonia gas and steam is supplied to a processing chamber that can be air-tightly closed. In the processing chamber, an aging process is performed for a wafer W. As a result, an insulation film material formed on the wafer W is wet-gelled. In addition, the reforming processing apparatus 25 performs a reforming process for the wafer W. The reforming processing apparatus 25 supplies a chemical or gas (for example, MHDS) for the reforming process to the wafer W. As a result, another molecule is structure-bonded to a molecular bonded edge portion of the insulation film coated on the wafer W. As a result, an insulation film formed on the wafer W can be reformed.

After the low oxygen heating temperature adjusting process (at step S12) is completed, the wafer W (not shown) is transferred to the resist coating apparatus (SCT) 24 of the first coating apparatus group 20 through the first transfer mechanism 50. The resist coating apparatus 24 forms a resist film on the wafer W. The resist film is for example an acetal resist.

Thereafter, while the wafer W on which the resist film has been formed is being held by the upper pair of tweezers 57 of the first transfer mechanism 50, the wafer W is transferred to the transferring table 40. The wafer W transferred to the transferring table 40 is held with the pair of tweezers 68 of the second transfer mechanism 60. Thereafter, the wafer W is transferred to for example the pre-baking unit (PREBAKE) 101 of the third processing apparatus group 100. The pre-baking unit (PREBAKE) 101 performs a predetermined heating process for the wafer W. After the heating process for the wafer W has been performed, while the wafer W is being held by the pair of tweezers 68 of the second transfer mechanism 60, the wafer W is transferred to the cooling unit (COL) 86 of the second processing apparatus group 80. The cooling unit (COL) 86 performs a cooling process for the wafer W. After the cooling unit (COL) 86 has performed the cooling process for the wafer W, the wafer W is transferred to the extension unit (EXT) 84 of the second processing apparatus group 80. The extension unit (EXT) 84 keeps the wafer W awaited.

Thereafter, the wafer W is transferred from the extension unit (EXT) 84 to the peripheral aligner 112 with the wafer transfer mechanism 110. The peripheral aligner 112 removes an unnecessary resist film from the periphery of the wafer W. Thereafter, the wafer W is transferred to the aligner 4. The aligner 4 performs a predetermined exposing process for the wafer W. After a pattern on the wafer W is exposed by the aligner 4, the wafer W is transferred to for example the post-exposure baking unit (PEB) 103 of the second heating processing apparatus group 100 by the wafer transfer mechanism 110. The post-exposure baking unit (PEB) 103 performs a heating process for the wafer W.

Thereafter, the wafer W is held by the pair of tweezers 68 of the second transfer mechanism 60. The wafer W is transferred to for example the cooling unit (COL) 87 of the second processing apparatus group 80. The cooling unit (COL) 87 performs a cooling process for the wafer W. After the cooling unit (COL) 87 performed the cooling process for the wafer W, it is held by the pair of tweezers 58 of the first transfer mechanism 50. The wafer W is transferred to the transferring table 40. Thereafter, while the wafer W is being held by the pair of tweezers 68, the wafer W is transferred from the transferring table 40 to for example the developing process unit (DEV) 31 of the second coating apparatus group. The developing process apparatus 31 performs a predetermined developing process for the wafer W. As a result, a predetermined resist pattern is formed on the wafer W.

After the developing process for the wafer W is performed, while the wafer W is being held by the pair of tweezers 67 of the second transfer mechanism 60, the wafer W is transferred to for example the post-baking unit (POBAKE) 105 of the third processing apparatus group 100. The post-baking unit (POBAKE) 105 performs a heating process for the wafer W for which the developing process is performed. After the heating process for the wafer W has been performed by the post-baking unit (POBAKE) 105, while the wafer W is being held by the pair of tweezers 67 of the second transfer mechanism 60, the wafer W is transferred to the transferring table 40.

After the wafer W is transferred to the transferring table 40, while the wafer W is being held by the pair of tweezers 58 of the first transfer mechanism 50, the wafer W is transferred to for example the cooling unit (COL) 88 of the second processing apparatus group 80. The cooling unit (COL) 88 actively performs a cooling process for the wafer W to a predetermined temperature.

After the cooling process for the wafer W is performed, the wafer W is transferred to for example the extension unit (EXT) 74 of the first processing apparatus group 70 through the first transfer mechanism 50. The extension unit (EXT) 74 keeps the wafer W awaited. Thereafter, the wafer W is transferred from the extension unit (EXT) 74 by the wafer transfer mechanism 11. The wafer transfer mechanism 11 places the wafer W in a cassette C on the cassette holding table 10.

Thereafter, an etching unit (not shown) performs a dry etching process for the wafer W with a mask of a resist pattern so as to form through-holes in the insulation film composed of three layers. After the editing process for the wafer W has been performed, the resist pattern is peeled from the wafer W.

After the etching process and the resist pattern peeling process for the wafer W is performed, a conduction film is formed on the insulation film including the surface of the through-holes. As a result, a semiconductor device of which the conductive file and the lower layer wiring are connected via through-holes is accomplished.

Figure 7:
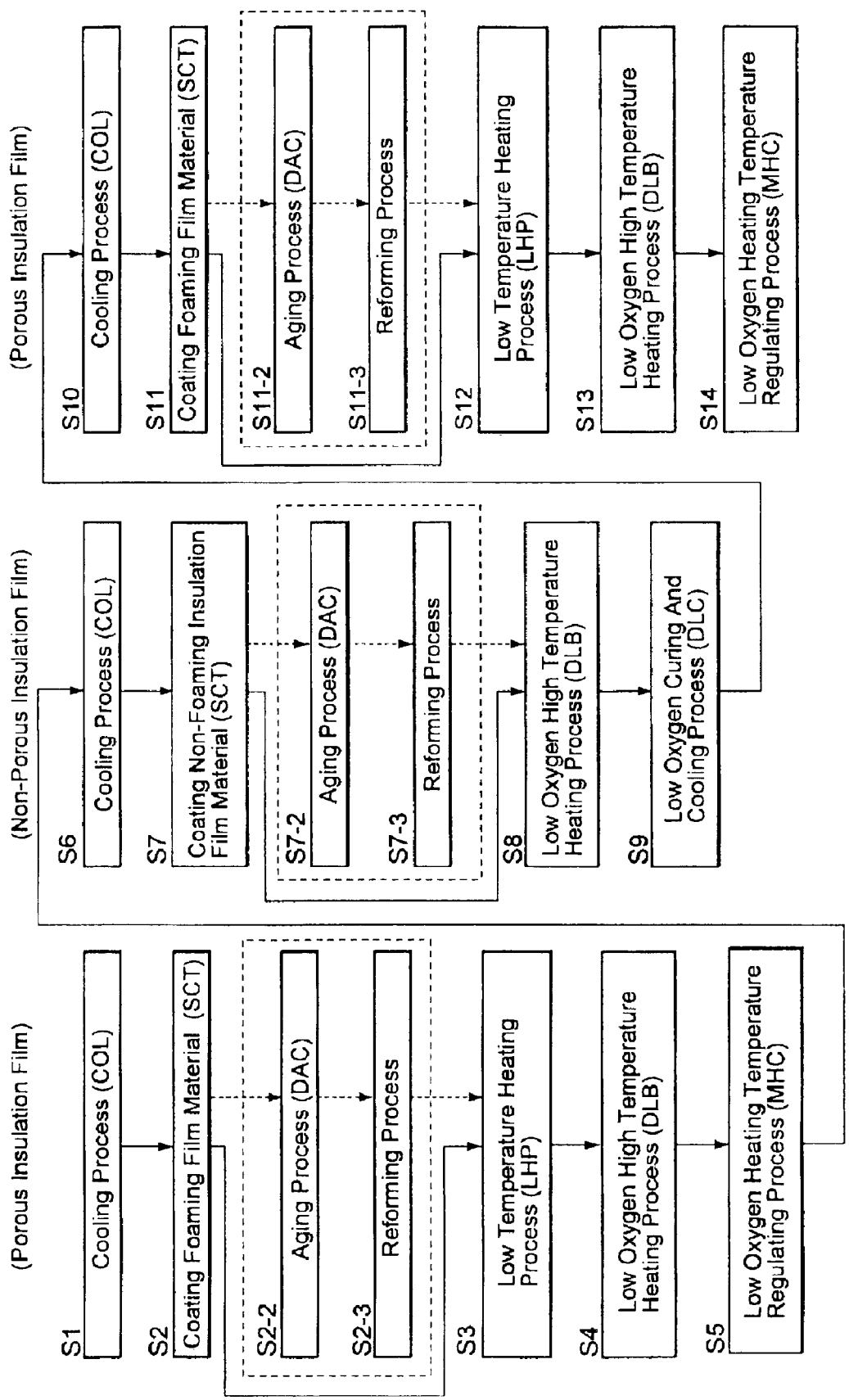
FIG. 7 is a flow chart showing semiconductor device fabrication processes according to another embodiment of the present invention.

According to the foregoing embodiment, when a porous insulation film is formed on a wafer W, after a heating process is performed for the wafer W by the low temperature hating processing apparatus (LHP), a heating process is performed for the wafer W by the low oxygen heating temperature regulating process apparatus (MHC). However, according to another embodiment, at steps S4 and S13 of FIG. 7, a process of the low oxygen high temperature heating process apparatus (DLB) can be performed between the process of the low temperature hating processing apparatus (LHP) and the process of the low oxygen heating temperature regulating process apparatus (MHC). In this case, when a porous insulation film is formed on a wafer W, the controller selects the foaming insulation film material coating apparatus (SCT) as a coating apparatus and the low oxygen high temperature heating process apparatus (DLB) and the low oxygen heating temperature regulating process apparatus (MHC) as heating apparatuses as major apparatuses to which the wafer W is transferred. When a non-porous insulation film is formed on a wafer W, the controller selects the non-foaming insulation film material coating apparatus (SCT) as a coating apparatus and the low oxygen high temperature heating process apparatus (DLB) as a heating apparatus as major apparatuses to which the wafer W is transferred. In this case, an ideal porous film is formed with the low oxygen high temperature heating process apparatus (DLB). The porous film can be dual-bounded by the low oxygen heating temperature regulating process apparatus (MHC).

Thus, in the film forming apparatus according to the embodiment, since the controller that selects processing apparatuses to which a wafer W is transferred corresponding to a film to be formed on the wafer W, when a laminate film composed of a porous insulation film and a non-porous insulation film is formed, it is not necessary to transfer the wafer W between different systems unlike the prior art. Thus, according to the present invention, a film forming process can be effectively performed.

Next, the case that the present invention is applied to the dual damascene method will be described.

In the same manner as shown in FIGS. 5A, 5B, 5C, and 5D, a lower layer wiring 201, a porous insulation film 202, a non-porous insulation film 203, and a porous insulation film 204 are successively formed as shown in FIGS. 14A, 14B, 14C, and 14D. Next, as shown in FIGS. 14E, 14F, 14G, and 14H, a wiring groove 205 and a contract hole 206 are formed with the etching method. As shown in FIG. 14G, a barrier metal layer 207 is formed with the plating method. Thereafter, as shown in FIG. 14H, for example a copper 208 is buried and the CMP (Chemical Mechanical Polishing) process is performed therefore so that both a wiring and a connector are formed at a time. In FIGS. 14E to 14H, although an etching unit, a PVD unit, and so forth are used, in the film forming apparatus according to the present invention, a photolithography process is performed for the etching process.

Figure 14A:
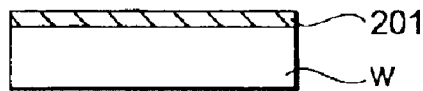
FIGS. 14A, 14B, 14C, 14D, 14E, 14F, 14G, and 14H are schematic diagrams for explaining semiconductor device fabrication processes with dual damascene method.
Figure 14B:
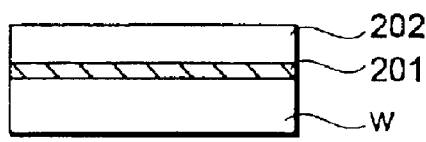
Figure 14C:
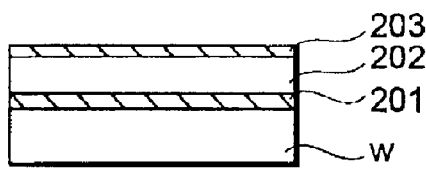
Figure 14D:
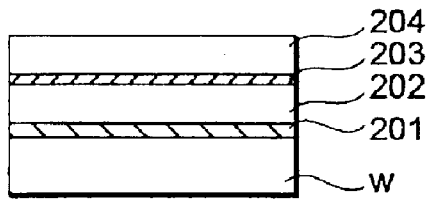

According to the embodiment, in FIGS. 14B to 14D, the porous insulation films 202 and 204 are coated by the foaming insulation film material coating apparatus (SCT) 23. The non-porous insulation film 203 is coated by the non-foaming insulation film material coating apparatus (SCT) 21. Generally, the front surface of a porous insulation film is largely rugged in comparison with the surface flatness of a non-porous insulation film. In other words, the surface roughness of a porous insulation film is larger than the surface roughness of a non-porous insulation film. However, according to the embodiment, since the non-porous insulation film 203 as an upper layer is formed on the porous insulation film 202 as a lower layer by the spin coat process, even if the surface roughness of the porous insulation film 202 is large, the non-porous insulation film 203 can be equally formed so that the surface thereof becomes flat.

Since a porous film cannot be formed with the conventional CVD method at present, the porous insulation film 202 should be formed with the spin coat process. According to the present invention, in consideration of such a situation, both a porous insulation film and a non-porous insulation film are formed with the spin coat process. As a result, it is not necessary to transfer a wafer W between different systems unlike the prior art. Thus, the film forming process can be effectively performed. As a result, the installation space of the apparatus can be reduced. In addition, as was described above, the non-porous insulation film 203 can be equally formed so that the front surface thereof becomes flat.

In addition, according to the embodiment, as the porous insulation film 202, an organic insulation film can be used. As the non-porous insulation film 203 and the porous insulation film 204, inorganic films can be used. Alternatively, as the porous insulation film 202 and the non-porous insulation film 203, organic films can be used. As the porous insulation film 204, an organic film can be used. As an organic film, for example "Porous Silk" of Dow Chemical Company can be used. As an inorganic film, for example "LKD Series" of JSR Company or "HSG Series" of Hitachi Chemical Co., Ltd. can be used.

Figure 14E:
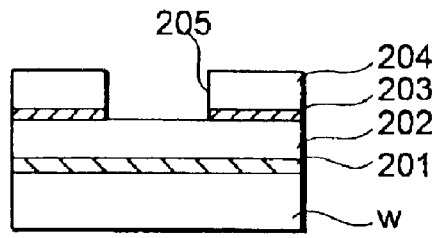
Figure 14F:
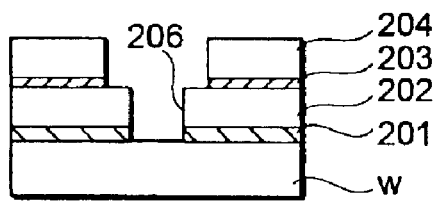
Figure 14G:
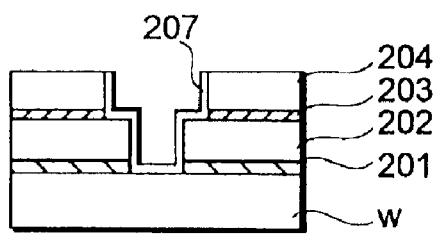
Figure 14H:
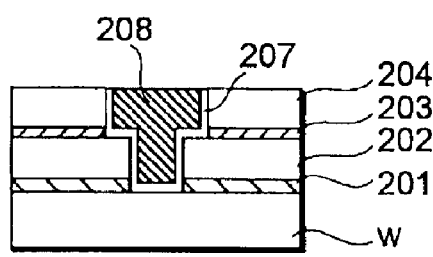

Before the etching process shown in FIGS. 14E and 14F is performed, since a resist film as an organic film is formed on the porous insulation film 204, it is necessary to use an inorganic film as the porous insulation film 204.

In addition, according to the forgoing embodiment, as a substrate, a semiconductor wafer was exemplified. Alternatively, the present invention can be applied to a substrate for a liquid crystal unit.

According to the present invention, since a selecting means for selecting processing apparatuses to which a wafer W is transferred corresponding to a film to be formed on the wafer W is disposed, film forming processes for a porous insulation film and an non-porous insulation film can be performed in the same system. Thus, unlike the prior art, it is not necessary to transfer a wafer W between different systems. As a result, a film forming process can be effectively performed. Thus, the installation space for the apparatus can be reduced.

In addition, according to the present invention, a flat insulation film as an upper layer can be formed on a porous insulation film as a lower layer, improving throughput.

The disclosure of Japanese Patent Application No. 2001-267395 filed Sep. 4, 2001 including specification, drawings and claims are herein incorporated by reference in its entirety.

Although only some exemplary embodiments of this invention have been described in details as above, those skilled in the art should readily appreciate that many modifications are possible in the exemplary embodiments without materially departing from the novel teachings and advantages of this invention. Accordingly, all such modifications are intended to be included within the scope of this invention.

What is claimed is:

1. A method for forming a film on a substrate, comprising:
    coating a porous insulation film material on the substrate with a spin coat process;
    heating the substrate on which the porous insulation film material is coated in an air-tight closed chamber at a first temperature in an atmosphere of oxygen concentrated below 1000 ppm while the deaerating inside the chamber creating at least a reduced pressure environment so as to form a first insulation film thereon;
    cooling the first insulation film formed by heating the porous insulation film material;

coating a non-porous insulation film material on the first insulation film with the spin coat process after cooling the first insulation film;

heating the substrate on which the non-porous insulation film material after coating thereof at a second temperature lower than the first temperature in an atmosphere of oxygen concentration below 1000 ppm so as to form a second insulation film thereon;

coating a porous insulation film material on the substrate on which the second insulation film is formed; and forming a third insulation film on the substrate on which the porous insulation film material is coated thereon.

2. The method as set forth in claim 1, further comprising:

reforming a front surface of the first insulation film, between the cooling and the coating of the non-porous insulation film material.

3. The method as set forth in claim 2, further comprising:

coating a solvent on the first insulation film with the spin coat process, before the reforming.

4. The method as set forth in claim 1, wherein the first insulation film is a porous organic film and the second insulation film is a non-porous inorganic film.

5. The method as set forth in claim 1, wherein the cooling temperature of the first insulation film is approximately 23 degrees Celsius.

6. The method as set forth in claim 1, wherein the substrate coated with the porous insulation film material is heated for thirty minutes.

7. The method as set forth in claim 1, wherein the substrate coated with the non-porous insulation film material is heated for five minutes.

8. The method as set forth in claim 1, wherein the third insulation film is a porous inorganic film.

9. The method as set forth in claim 1, wherein side walls of the air-tight closed chamber is heated in a manner that a lower portion of the walls is controlled to have a lower temperature than an upper portion thereof so that an upper current of the air remained inside the chamber is created to accelerate the deaeration.

\* \* \* \* \*